United States Patent [19]
Patterson

[11] 3,931,514
[45] Jan. 6, 1976

[54] OPTICAL SWITCHING SYSTEM

[75] Inventor: David Ross Patterson, Trenton, N.J.

[73] Assignee: RCA Corporation, New York, N.Y.

[22] Filed: Dec. 20, 1974

[21] Appl. No.: 534,880

[52] U.S. Cl. .............. 250/206; 250/227; 250/231; 250/551; 310/8.1; 307/117
[51] Int. Cl.² .................................. H01J 39/12
[58] Field of Search.... 250/231 R, 227, 206, 214 R, 250/551, 552; 310/8, 8.1, 8.7, 8.8; 307/117; 240/6.4 R

[56] References Cited
UNITED STATES PATENTS

| | | | |
|---|---|---|---|
| 3,440,347 | 4/1969 | Spencer et al. | 307/117 X |
| 3,629,590 | 12/1971 | Case | 250/551 |
| 3,701,903 | 10/1972 | Merhar | 310/8.1 |
| 3,803,419 | 4/1974 | Obenhaus | 250/552 X |
| 3,808,418 | 4/1974 | Conard et al. | 310/8.7 X |

*Primary Examiner*—Walter Stolwein
*Attorney, Agent, or Firm*—Edward J. Norton; William Squire

[57] ABSTRACT

In an optical switching system having a transmitter and a receiver optically coupled together via a fiber optic light guide, the transmitter utilizes a piezoelectric device which provides an electrical signal to a light emitting device when a mechanical strain is imparted to the piezoelectric device. The light emitted by the light source is provided at the receiver via the fiber optic guide. The receiver generates a signal in response to the light received thereat via the fiber optic guide. This generated signal is used to control the power flowing to a load via a switching device so that, for example, one generated signal is used to turn on the switching device and the next succeeding generated signal is used to turn off the switching device.

15 Claims, 2 Drawing Figures

OPTICAL SWITCHING SYSTEM

The present invention generally relates to an optical switching system and more particularly to an optical switching system utilizing a piezoelectric device, a fiber optic guide, a light responsive circuit and a switching device to control the flow of power to a load.

There are many applications for an optical switching system of the type described herein. One of the most important of these applications is in the area of home or commercial lighting systems. More specifically, a particularly advantageous application for the present invention is in overhead lighting. At the present time, copper wire and labor for the installation of a wall switch, wiring and an overhead fixture are costly. Utilization of a system in accordance with the present invention is a relatively inexpensive alternative to the present day wired overhead arrangement. The transmitter, to be described more fully herein, corresponds to the present day wall switch. The receiver, which will also be described more fully herein, corresponds to the overhead fixture and the fiber optic light guide would replace the copper wiring from the switch to the overhead fixture.

Another feature of a lighting system utilizing the teaching of the present invention is that the transmitter does not require the presence of the house power at the transmitter location. Thus, the electrical shock hazard at the transmitter is substantially eliminated in contradistinction to the potential shock hazard at the wall switch in a conventional system. Although the system described herein is advantageously utilized in a lighting system, it will be clear that such a system can be used in a plurality of switching type applications.

In accordance with the present invention, a system is described for controlling the power provided to a load from a source of power. The system comprises a transmitter, a receiver and a fiber optic light guide operatively coupling the transmitter to the receiver. The transmitter comprises a piezoelectric device coupled to a light source. The light source emits light in response to the operation of the piezoelectric device. The fiber optic light guide is positioned to receive the light from the light source on one end of the guide. The receiver comprises a light detection means positioned to detect the light from the light source provided at the other end of the guide. The light detection means provides a switching signal in response to the detected light. The receiver further comprises a switching means which is connected in circuit with the load and the source of power. The switching means responds to a given occurrence of the switching signal for enabling the flow of power to the load. The switching means also responds to the occurrence of the switching signal following the given occurrence for preventing the flow of power to the load.

Figure 1:
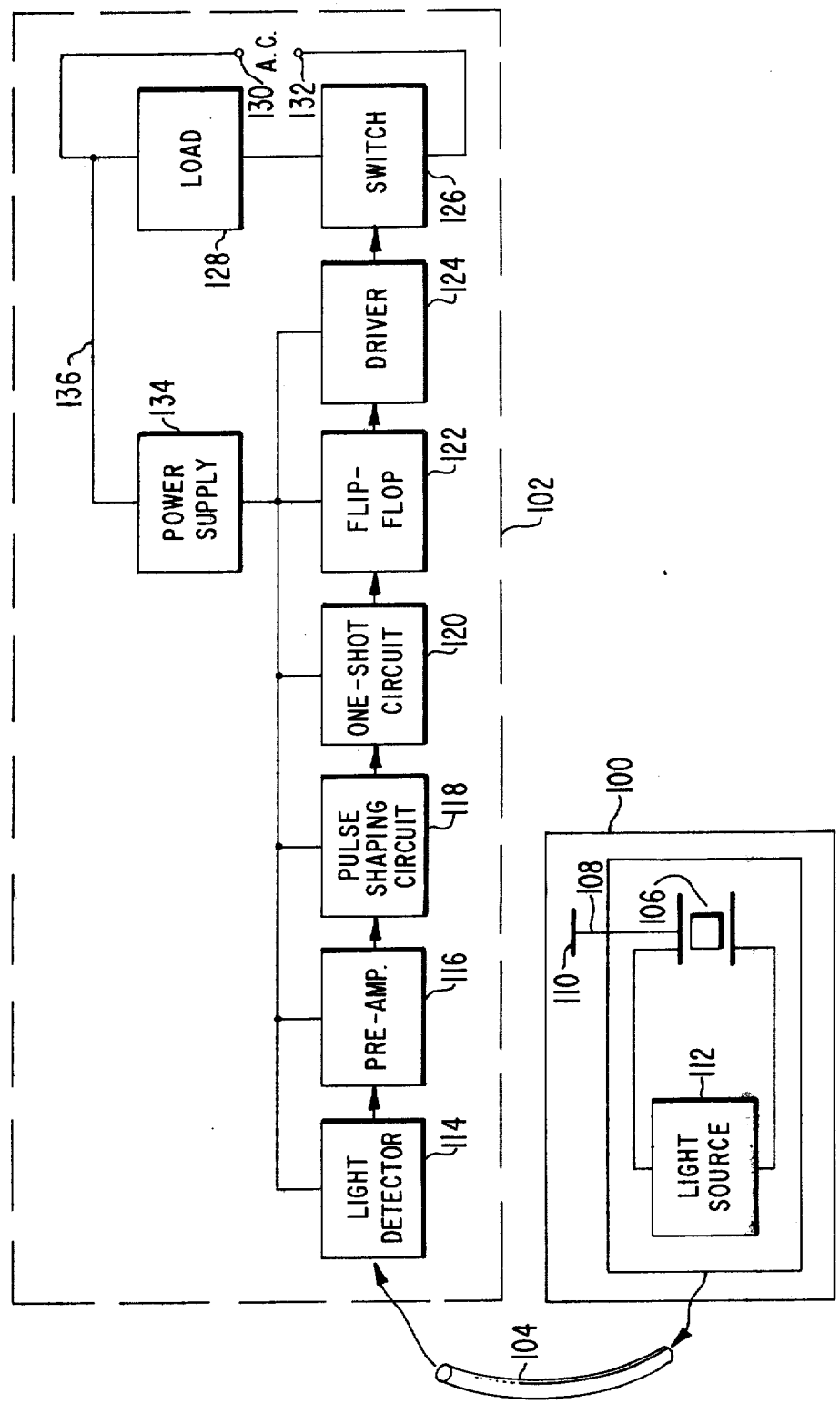
FIG. 1 is a block diagram of one embodiment of the present invention.

Referring now to FIG. 1 there is shown generally a transmitter 100 and a receiver 102 operatively coupled to each other via a fiber optic light guide 104.

The transmitter 100 shown in FIG. 1 comprises a piezoelectric device 106 which is contained within a mechanical strain imparting device 108. The device 108 is arranged such that when the plunger 110 is pressed the piezoelectric device 106 has applied thereto a momentary mechanical strain. That is, the device 108 is spring loaded in such a fashion that the piezoelectric device 106 receives a momentary type of impact.

When the plunger 110 is depressed and the piezoelectric device 106 receives a momentary mechanical strain the device 106 provides, in this case, a pulse of voltage. This sharp pulse of voltage is provided across the terminals of a light source 112. The pulse-like voltage across the light source 112 is effective to cause the light source 112 to generate a pulse of light. The pulse of light which is generated by the light source 112 in the transmitter 100 is picked up on one end of the fiber optic light guide 104. The light guide 104 transmits by way of internal reflections the pulse of light so generated at the transmitter 100 and provides this light at a light detector 114 located within the receiver 102.

The light detector 114 detects the presence of the light from transmitter 100 at the other end of the fiber optic light guide 104 and provides an electrical signal in response thereto. The electrical signal provided by the light detector 114 is provided at a preamplifier circuit 116. Preamplifier circuit 116 raises the amplitude level of the electrical signal provided by the detector 114 to a level which will be compatible with the circuitry to be described.

The amplified electrical signal which is a pulse-type signal from preamplifier 116 is provided to a pulse shaping circuit 118. Pulse shaping circuit 118 is designed to square up the pulse provided at the input terminal thereof. The squared up pulse from circuit 118 is provided at the input terminal of one-shot circuit 120. Circuit 120 imparts a particular pulse width to the pulses provided from the pulse shaping circuit 118. The time duration of the pulses provided by circuit 120 is designed for optimum operation of the circuitry which follows the oneshot circuit 120.

The electrical pulses which have been squared up and widened out and provided at the output of the circuit 120 are provided at the input terminal of a flip-flop circuit 122. Flip-flop circuit 122 is designed such that upon the application of one pulse thereto from circuit 120 the output signal of circuit 122 will go to a high voltage level. Upon the very next application of a pulse to the input terminal of circuit 122 the output terminal will go to a low voltage level. The next pulse applied to circuit 122 causes the output terminal to once again go high. Thus, the output terminal of flip-flop circuit 122 has two stable states, that is, a high and a low voltage stable state, which will change from one state to the other upon the application of a pulse to the input terminal of flip-flop 122. The output terminal of flip-flop 122 is connected to a driver circuit 124. Driver circuit 124 responds to the two previously mentioned stable states to provide control signals to switch 126. Switch 126 is connected in circuit with a load 128 and a pair of terminals 130 and 132 which are adapted for connection to a source of AC power. Also shown in FIG. 1 is a power supply 134 which supplies operating potentials for much of the circuitry within the receiver 102. Power supply 134 operates directly from the AC supply connected to terminals 130 and 132 via line 136.

In the present embodiment of the invention shown in block diagram form in FIG. 1, the transmitter 100 is preferably located on a wall very much in the fashion of a common wall switch in a wired lighting system. The user simply depresses the plunger 110 of the device 108 to impart a momentary impact on the pieozelectric device 106. This operation generates a pulse signal causing the light source 112 to emit a pulse of light. This short duration pulse of light is transmitted via the fiber optic light guide 104 from the transmitter 100 to the light detector 114 located at the receiver 102. The receiver 102 is preferably located within the overhead receptacle or mount for a standard incandescent light bulb. That is to say, the load 128 is a light bulb and the circuitry contained within the receiver 102 is preferably located in physical proximity with the load 128. The light from the fiber optic light guide is transformed into an electrical pulse via the light detector 114. This electrical pulse is amplified, shaped and stretched via the circuits 116, 118 and 120 respectively. The voltage state at the output terminal of flip-flop 122 is sent to the high state, assuming it had been previously in the low state, and the driver circuit 124 is enabled such that a control signal is provided to the switch 126 which renders switch 126 into a low impedance condition. When switch 126 is in this fashion rendered into its low impedance state, current flow is enabled in the series circuit comprising terminals 130, 132, the load 128 and the main terminals of switch 126. In this manner the light represented by the load 128 is turned on.

When the user desires to turn off the light represented by the load 128, he merely depresses the plunger 110 in the transmitter 100. Once again a light pulse is conveyed to the receiver 102 which is converted into an electrical signal and is processed as before. Now flip-flop 122 changes to the low stable state causing the driver circuit 124 to send a turn off command to switch 126. Upon the receipt of a turn off command from the driver 124, the switch 126 is rendered into a high impedance condition and in this fashion prevents the flow of current through the load 128 from the terminals 130 and 132. In this manner, the light represented by the load 128 is turned off.

Thus, it will be seen that the arrangement shown in FIG. 1 provides an optical switching system having a one pulse-on one pulse-off characteristic. It will be noted that in the arrangement so described there is no AC or DC power provided at the transmitter 100. Thus, the potential shock hazard at the location where the user has the most contact with the system is greatly reduced if not totally eliminated. In addition, it will be noted that the circuitry both in the transmitter 100 as well as the receiver 102 is generally operated on a pulse basis which is very helpful in extending the useful life of the individual components making up the system.

Figure 2:
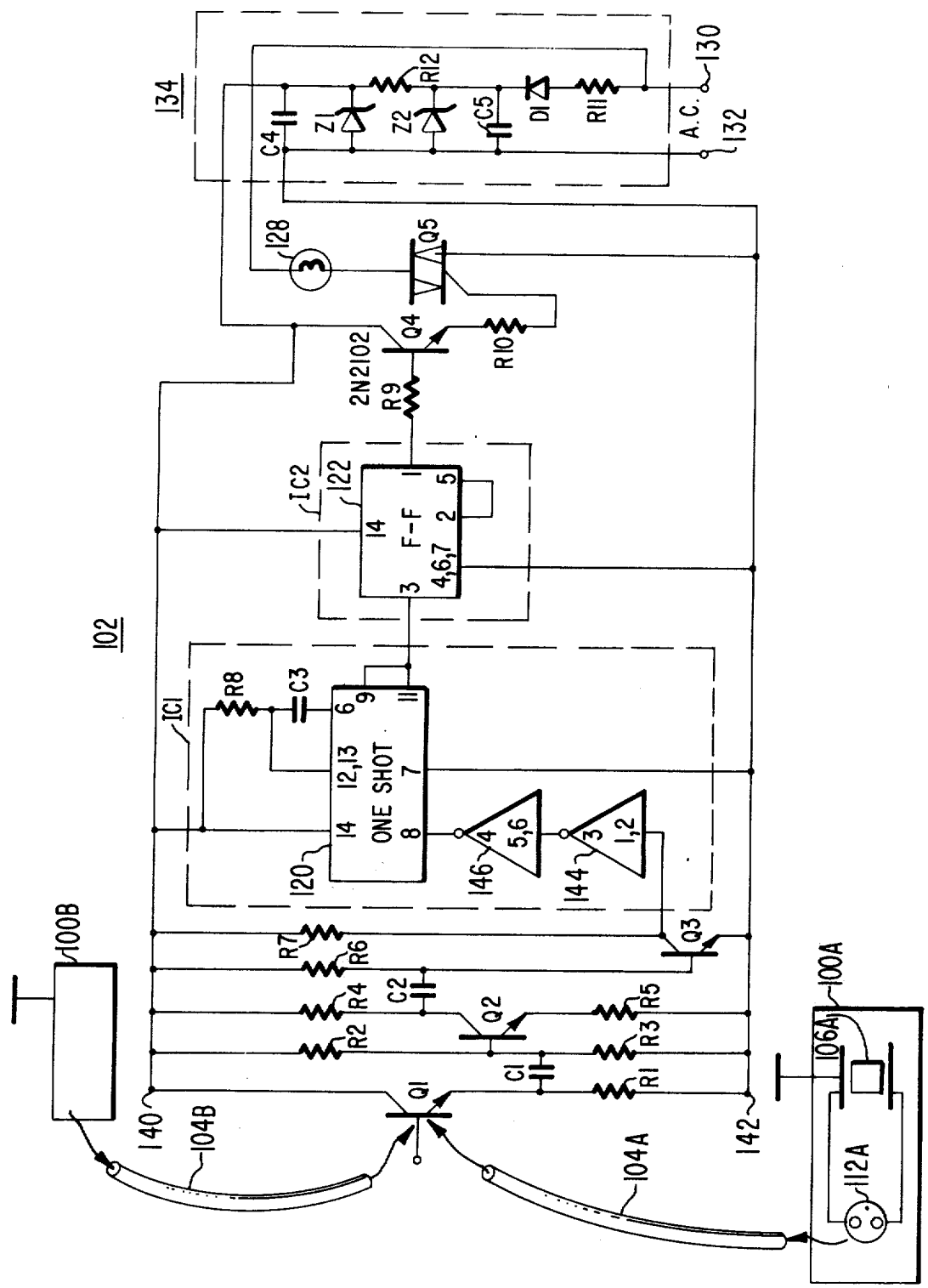
FIG. 2 is a detailed schematic drawing of the system shown in the block diagram of FIG. 1.

Referring now to FIG. 2, a detailed schematic drawing for the system shown in FIG. 1 is provided. In FIG. 2 a pair of transmitters 100A and 100B are shown. This illustrates the manner in which the system may be utilized to control the operation of a load such as a light from two separate locations. The receiver 102 will accept and process light pulses from either of the transmitters 100A or 100B. If so desired, additional transmitters may be employed. For each additional transmitter an additional fiber optic light guide, such as those shown as 104A and 104B must also be employed. Thus, the limitation on the number of transmitters which may be used is the available surface area of the light detector located within the receiver 102.

In FIG. 2 the transmitter 100A utilizes a piezoelectric device 106A which is a commercially available device designated as model P/N 165239-4. This device operates to provide a pulse of voltage when a momentary mechanical strain is applied thereto. The voltage pulse supplied by device 106A is provided across the main terminals of a neon lamp model NE 2E. The neon lamp 112A is the light source for the transmitter 100A. In some applications it may be desirable to substitute a light emitting diode (LED) in place of the neon bulb.

The fiber optic light guide is preferably a plastic fiber commercially available under the trade name CROFON. These fibers have a core of polymethyl methacrylate sheathed with a very thin transparent polymer of lower refractive index. Light is transmitted by the fiber via the phenomenon of total internal reflection. The fiber optic light guide has a typical diameter of 20 mils, but is available for use in this application in both larger and smaller diameters. The light detector in FIG. 2 is a phototransistor Q1. The light from the fiber optic light guides such as 104A and 104B impinges on the light sensitive area of transistor Q1.

The collector electrode of transistor Q1 is connected to terminal 140. The emitter electrode of transistor Q1 is connected to terminal 142 via resistor R1. The emitter electrode of transistor Q1 is also connected to the base electrode of transistor Q2 via capacitor C1. The base electrode of transistor Q2 is connected to terminal 140 via resistor R2 and the base electrode of transistor Q2 is also connected to terminal 142 via resistor R3. The collector electrode of transistor Q2 is connected to terminal 140 via resistor R4 and the emitter electrode of transistor Q2 is connected to terminal 142 via resistor R5. The collector electrode of transistor Q2 is also connected to the base electrode of transistor Q3 via capacitor C2. The base electrode of transistor Q3 is connected to terminal 140 via resistor R6. The collector electrode of transistor Q3 is connected to terminal 140 via resistor R7 and the emitter electrode of transistor Q3 is connected directly to terminal 142. Transistors Q2 and Q3 are both NPN type transistors. Transistors Q2 and Q3 provide the amplification function described with respect to the pre-amp circuit 116 in FIG. 1.

The pulse shaping circuit 118 and the one-shot circuit 120 are implemented in FIG. 2 by the utilization of a commercially available digital integrated circuit IC1, model No. CD4001. The collector electrode of transistor Q3 is connected to terminals 1 and 2 of the digital IC1. Terminal 3 of IC1 is connected to terminals 5 and 6 and terminal 4 corresponds to the output terminal of the pulse shaping circuit 118. In FIG. 2 the pulse shaping function is provided by the two inverters 144 and 146 which are both found within IC1.

The one-shot circuit 120 is also formed from circuitry within IC1. Terminal 4 is connected to terminal 8. Terminal 6 is connected to terminal 140 via capacitor C3 and resistor R8. Terminals 12 and 13 of IC1 are connected to the junction between capacitor C3 and resistor R8. Terminal 14 of IC1 is connected to terminal 140 and terminal 7 of IC1 is connected to terminal 142. Terminal 9 of IC1 is connected to terminal 11 of IC1. The output signal from the one-shot circuit 120 is provided at IC1 terminal 11.

The flip-flop circuit 122 is formed from half of the circuitry found on the commercially available IC2, designated as Model No. CD 4013. The input terminal of flip-flop 122 corresponds to IC2 terminal 3. Terminals 4, 6 and 7 of IC2 are connected together and are subsequently connected to terminal 142. Terminals 2 and 5 of IC2 are connected together. Terminal 14 of IC2 is connected to terminal 140 and the output terminal of the flip-flop circuit 122 corresponds to terminal 1 of IC2.

The output terminal of flip-flop 122 is connected to the base electrode of the driver transistor Q4 via resistor R9. The collector electrode of driver transistor Q4 is directly connected to terminal 140. The emitter electrode of transistor Q4 is connected to one end of resistor R10. Driver transistor Q4 is an NPN type transistor designated as 2N2102.

The other end of resistor R10 is connected to the gate electrode of thyristor Q5 which functions as the switch 126. Thyristor Q5 is in the present embodiment a triac designated as model No. 40526. One main electrode of thyristor Q5 is connected to terminal 142. The other main electrode of thyristor Q5 is connected to one terminal of the load 128 which is in this case an incandescent light bulb. Load 128 is connected to the AC line terminal 130. The other line terminal 132 is connected directly to terminal 142.

FIG. 2 also shows the details for the implementation of power supply 134. Power supply 134 comprises resistor R11 in series with diode D1, designated as 1N3254, both being connected in series with resistor R12 between terminal 130 and terminal 140. The power supply 134 further comprises a capacitor C4 connected between terminal 140 and terminal 142. A Zener diode Z1 is connected across capacitor C4. A second Zener diode Z2 is connected between terminal 142 and the junction of diode D1 and resistor R12. Zener diodes Z1 and Z2 are designated as UZ706 and UZ712 and have a Zener breakdown voltage of 6 volts and 12 volts respectively. Capacitor C5 is connected directly across Zener diode Z2.

Table I shows the values of the resistors and capacitors for the system shown in FIG. 2 as well as the designations for the transistors, diodes and integrated circuits used in FIG. 2.

TABLE I

| Piezoelectric Device 106 | P/N165239-4 |
|---|---|
| R1 | 1K ohms |
| R2 | 68K ohms |
| R3 | 10K ohms |
| R4 | 27K ohms |
| R5 | 270 ohms |
| R6 | 470K ohms |
| R7 | 5.6K ohms |
| R8 | 100K ohms |
| R9 | 5.6K ohms |
| R10 | 470 ohms |
| R11 | 2K ohms |
| R12 | 390 ohms |
| C1 | 470pf |
| C2 | .1 µf |
| C3 | 1 µf |
| C4 | 100 µf |
| C5 | 50 µf |
| Q1 | MT-1 |
| Q2 | 2N4124 |
| Q3 | 2N4124 |
| Q4 | 2N2102 |
| Q5 | 40526 |
| IC1 | CD4001 |
| IC2 | CD 4013 |
| Z1 | UZ 706 |
| Z2 | UZ 712 |
| D1 | 1N3254 |

Thus, FIG. 2 shows a practical implementation of the general optical switching system shown in block diagram form in FIG. 1 as it pertains to a system for turning on and turning off an electric light. It will be seen that the components used to make the practical system of FIG. 2, are readily available and that the system is not complex or costly to implement.

What is claimed is:

1. A switching system for controlling the power provided to a load from a source of power comprising:
   a transmitter comprising a piezoelectric device coupled to a light source, said light source emitting light in response to the operation of said piezoelectric device;
   a fiber optic light guide positioned to receive on one end thereof the light emitted from said light source; and
   a receiver comprising:
   light detection means positioned to detect the light emitted from said light source from the other end of said fiber optic light guide and for providing a switching signal in response thereto;
   a switching means connected in circuit with said load and said source of power and responsive to a given occurrence of said switching signal for enabling the flow of power to said load and responsive to the occurrence of said switching signal following said given occurrence for preventing the flow of power to said load.

2. The switching system according to claim 1 wherein said light source comprises a neon lamp.

3. The switching system according to claim 1 wherein said light source comprises a light emitting solid state device.

4. The switching system according to claim 1 wherein said light detection means comprises a solid state light responsive device.

5. The system according to claim 1 wherein said switching means comprises a flip-flop circuit having first and second stable states, said flip-flop circuit being placed in said first stable state in response to said given occurrence of said switching signal and being placed in said second stable state in response to the occurrence of said switching signal following said given occurrence.

6. The switching system according to claim 5 further comprising a solid state switching device having first and second main electrodes and a control electrode, said control electrode being connected in circuit with said flip-flop circuit, said main electrodes being connected in circuit with said load, said switching device exhibiting a low impedance between said main electrodes in response to said first stable state of said flip-flop circuit and a high impedance between said main electrodes in response to said second stable state of said flip-flop circuit.

7. A switching system for controlling the power provided to a load from a source of power, said system comprising:
   a transmitter comprising:
   a piezoelectric device;
   a light source connected across said piezoelectric device; and
   means for imparting a mechanical strain to said piezoelectric device;
   at least one fiber optic light guide, one end of said fiber optic light guide being positioned with respect to said transmitter for receiving the light emitted from said light source at said one end; and
   a receiver comprising:

a light detection means positioned in relation to the other end of said at least one fiber optic light guide to receive and detect the occurrence of light emitted from said light source and for providing a first electrical signal in response to the detection of said occurrence of light;

signal conditioning means, responsive to said first electrical signal for providing a second electrical signal having a desired amplitude level;

a flip-flop circuit having an input and an output terminal, said flip-flop circuit exhibiting a first stable voltage level at said output terminal thereof in response to given occurrences of said second electrical signal applied to the input terminal thereof and exhibiting a second stable voltage level in response to other occurrences of said second electrical signal applied to the input terminal thereof; and a switching means connected in circuit with said load and said source of power and responsive to said first stable voltage level for enabling the flow of power from said source to said load and responsive to said second stable voltage level for preventing the flow of power from said source to said load.

8. The switching system according to claim 7 comprising a plurality of transmitters and a corresponding plurality of fiber optic light guides, the other end of each one of said plurality of fiber optic light guides being positioned such that the light from the corresponding light source is received and detected by said light detection means.

9. The switching system according to claim 7 wherein said piezoelectric device is responsive to momentary mechanical strain imparted by said means for imparting a mechanical strain.

10. The switching system according to claim 9 wherein said light detection means comprises a light responsive transistor.

11. The switching system according to claim 10 wherein said signal conditioning means comprises an amplification means and a pulse forming means.

12. The switching system according to claim 11 wherein said switching means comprises:

a driver circuit responsive to said first and second stable voltage levels for providing corresponding first and second driving signals respectively; and a solid state switching device having first and second main electrodes and a control electrode, said main electrodes thereof being connected in a series circuit with said load and said power source, said control electrode having said first and second driving signals applied thereto, said switching device exhibiting a low impedance between said main electrodes in response to said first driving signal and exhibiting a high impedance between said main electrodes in response to said second driving signal.

13. The switching system according to claim 12 wherein said switching device comprises a thyristor.

14. The switching system according to claim 13 wherein said light source comprises a neon bulb connected across said piezoelectric device.

15. The switching system according to claim 13 wherein said light source comprises a light emitting diode connected across said piezoelectric device.

* * * * *